United States Patent [19]

Skala et al.

[11] Patent Number: 5,027,432
[45] Date of Patent: Jun. 25, 1991

[54] MOTOR VEHICLE RADIO WITH AN AUTOMATIC VOLUME CONTROL DEVICE

[75] Inventors: Otto Skala, Rüsselsheim; Walter Rauth, Hochheim, both of Fed. Rep. of Germany

[73] Assignee: Delco Electronics Corporation, Kokomo, Ind.

[21] Appl. No.: 349,628

[22] Filed: May 10, 1989

[30] Foreign Application Priority Data

May 18, 1988 [DE] Fed. Rep. of Germany ....... 3816918

[51] Int. Cl.⁵ .............................................. H04B 1/16
[52] U.S. Cl. ................................................. 455/238
[58] Field of Search .............. 455/238, 239, 234, 232; 381/107, 108

[56] References Cited

U.S. PATENT DOCUMENTS 2,080,554  5/1937  Wolff .................................. 455/238
4,558,460 12/1985  Tanaka et al. ...................... 455/238

FOREIGN PATENT DOCUMENTS 0219834 12/1983  Japan .................................. 455/238

*Primary Examiner*—Reinhard J. Eisenzopf
*Assistant Examiner*—Lisa Charouel
*Attorney, Agent, or Firm*—Albert F. Duke

[57] ABSTRACT

The invention relates to a motor vehicle radio with an automatic volume control device (20) and a manual volume-setting device (14). The automatic volume control device (20) is fed with a speed signal detected by a speed sensor and delivers a volume signal associated with the detected speed signal. The manual volume-setting device (14) generates a volume signal corresponding to the volume which has been set. A two-position switch (16) is provided for selectively applying the volume signal from the automatic volume control device (20) or from the manual volume-setting device (14) to an output stage (12) which feeds the loudspeakers (13). When the manual volume-setting device (14) is switched on, following a detection signal for a desired vehicle speed, the volume signal corresponding to the volume which has been set can be stored in a storage and control circuit (23) of the automatic volume control device (20).

6 Claims, 1 Drawing Sheet

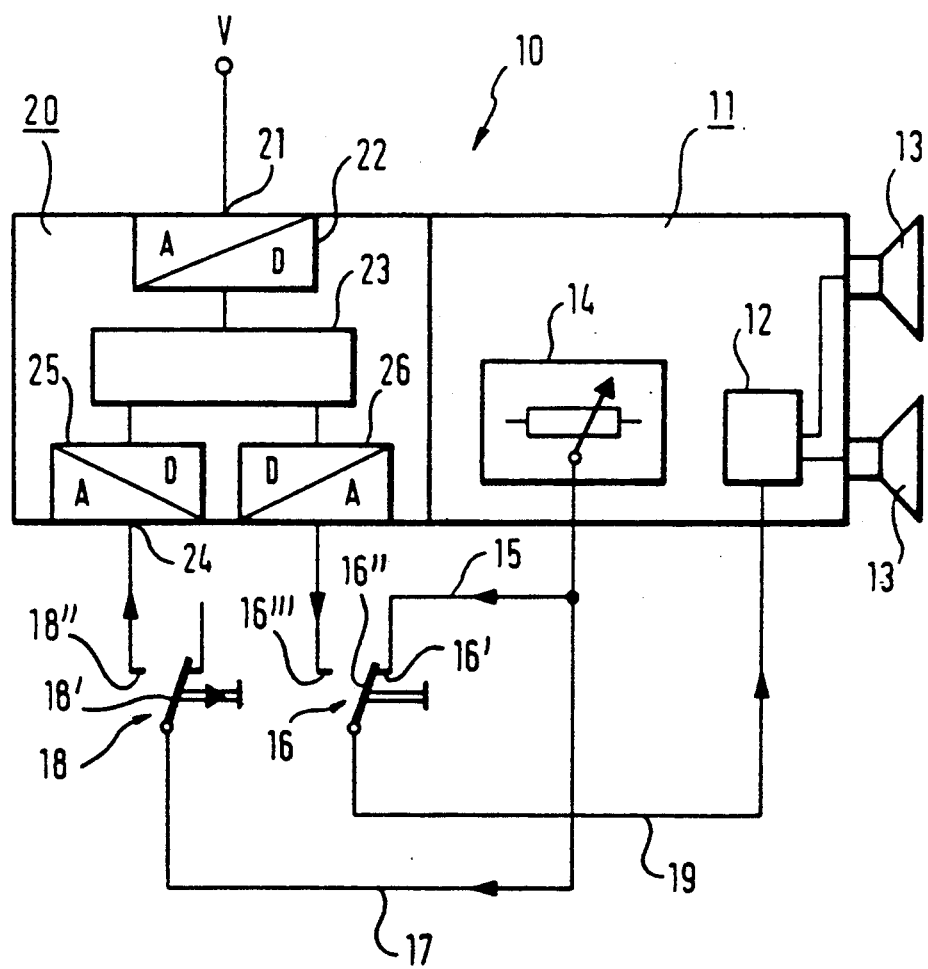

MOTOR VEHICLE RADIO WITH AN AUTOMATIC VOLUME CONTROL DEVICE

FIELD OF THE INVENTION

The invention relates to a motor vehicle radio with an automatic volume control device, to which is fed a speed signal detected by a speed sensor and which delivers a volume signal associated with the detected speed signal, and with a manual volume-setting device which generates a volume signal corresponding to the volume which has been set.

BACKGROUND OF THE INVENTION

A motor Vehicle radio is known from DE-OS (German Preliminary Patent) 2,547,659, which has a control device for controlling the volume, where the said control device delivers control voltages, as a function of a signal representing the noise level in the vehicle, to the output stage of the radio. Here a signal dependent on the speed of the vehicle, e.g. the r.p.m. of the engine or the r.p.m. of the drive shaft, is used as the signal representing the noise level.

This known motor vehicle radio has the disadvantage that its sound volume can be controlled only as a function of the speed of the vehicle. Here changes in noise level which are independent of the speed, for example those due to differences in the tires, especially during winter operation, and to travel in rainy weather, are not taken into consideration, nor are individual hearing problems of the user.

Now in order to be able to adapt the sound volume of a motor vehicle radio to such speed-independent changes in noise level, a motor vehicle radio has already been provided according to DE-OS 2,646,232, which has a volume adjustment which depends on the noise level. In this known radio, a noise-detecting measuring probe or a microphone is necessary, whose output signal acts through a deep-pass filter on a control circuit, which then raises or lowers the sound volume of the radio as a function of this signal which characterizes the noises in the surroundings.

Apart from the fact that it is not possible, even in this radio, to adjust individually to hearing problems of the user, a relatively expensive measuring probe, with the appropriate circuitry, is required.

In contrast, the object of the invention is to provide a motor vehicle radio appropriate to the requirements, in which the automatic control of the sound volume can be adjusted optimally to the vehicle and user specific circumstances.

This object is achieved, in accordance with the invention, by having a two-position switch for selectively applying the volume signal of the automatic volume control device or of the manual volume-settinq device to an output stage of the radio which feeds the loudspeakers, and has a storage and control circuit which includes a memory, in which the volume signal corresponding to the volume which has been set can be stored, when the manual volume-setting device (14) is switched on, following a detection signal for a desired vehicle speed.

In accordance with the invention, therefore, the volume of the motor vehicle radio can be set automatically or manually, as desired, where, when the volume is set manually, the volume which has been set can be stored as a simple detection signal, together with the associated speed, so that this speed/volume signal pair then can be used subsequently for the automatic volume control.

By this means it is possible to build the motor vehicle radio of the invention into any motor vehicle which is equipped with a speed sensor, and any user can then adapt the automatic volume control device individually to his needs. Thus each driver can simply preprogram his individual sound volume, which is then set automatically as a function of the speed at which the vehicle is traveling at any moment.

In a first example of an embodiment of the invention, it is provided that the volume signal of the manual volume-setting device can be applied to the automatic volume control device by means of a momentary-contact switch. In this way, an especially simple operation of the motor vehicle radio of the invention is achieved, Wherein the speed-dependent adjustment of the automatic volume control device by the driver practically does not distract him from traffic.

In another development of the invention, it is provided that the volume signal of the manual volume-setting device can be applied to the storage and control circuit of the automatic volume control device through an analog-to-digital converter. This makes it possible to use the voltage signal which is to be applied to an output stage of the radio as a volume signal corresponding to the volume which has been set.

In order to further simplify the circuitry of the motor vehicle radio in accordance with the invention, it is also provided that the digitalized volume signal applied to the storage and control circuit serves as the detection signal.

A further example of an embodiment of the invention is distinguished by the fact that the volume signal supplied by the storage and control circuit as a function of the speed signal is applied through a digital-to-analog converter to the two-position switch as a voltage signal.

In order to construct the automatic volume control device of the motor vehicle radio in accordance with the invention in as flexible a manner as possible, it is provided, in a preferred embodiment of the invention, that the memory of the storage and control circuit is a write/read memory, the content of whose memory can be overwritten. In particular this makes it possible for various users of a motor vehicle to adapt the automatic volume control device individually to their hearing and to the prevailing weather conditions which affect the outside noise in any particular case.

SUMMARY OF THE INVENTION

The invention is described more fully below by means of examples, making use of the drawing In this drawing, the single Figure shows a schematic representation of a motor vehicle radio.

According to FIG. 1, a motor vehicle radio 10 has a customary radio component 11, to which a cassette recorder and/or another sound reproduction apparatus, e.g. a CD player, can be attached. (These are not represented.) Radio 10 is operated in known manner by means of operating knobs and/or buttons, not represented.

An output stage 12 of radio component 11 is connected to loudspeakers 13, in order to conduct sound signals to it which are to be made audible. A manual volume-setting device 14 is also provided in radio component 11. Volume-setting device 14 can be controlled by means of an operating knob, not represented. It is connected via a conductor 15 to a fixed contact 16' of a two-position switch 16 and via a conductor 17 to a movable contact 18' of a momentary-contact switch 18. A movable contact 16'' of two-position switch 16 is connected via an additional conductor 19 to the output stage 12 of radio component 11, so that a volume signal emitted by volume-setting device 14 can be applied via conductor 15 to two-position switch 16 and via conductor 19 to output stage 12, if movable contact 16'' of two-position switch 16 lies against the first fixed contact 16'.

Motor vehicle radio 10 further has an automatic volume control device 20 with a first input 21 to which a speed signal V can be fed by a speed sensor, not represented. The first input 21 of automatic volume control device 20 is connected to an analog-to-digital converter 22, which feeds a digital signal, corresponding to the speed of the vehicle, to a storage and control circuit 23.

A second input 24 of automatic volume control device 20, which feeds another analog-to-digital converter 25, is connected to a fixed contact 18'' of momentary-contact switch 18, so that the volume signal of the manual volume-setting device can be fed to momentary-contact switch 18 when the latter is actuated. Analog-to-digital converter 25 supplies a digital signal corresponding to the volume signal, or to the volume which has been set, to storage and control circuit 23 of automatic volume control device 20.

Storage and control circuit 23 is connected at its output side with a digital-to-analog converter 26, which converts a digital volume signal supplied by storage and control circuit 23 to an analog volume signal. The output of digital-to-analog converter 26 is connected to a second fixed contact 16''', of two-position switch 16, so that the volume signal supplied by the automatic volume control device can be applied, via two-position switch 16 and conductor 19, to output stage 12 of radio component 11, when movable contact 16'' of two-position switch 16 lies against the second fixed contact 16''', The motor vehicle radio 10 described here operates as follows If motor vehicle radio 10 is switched on in the usual manner, the radio program being received or the music coming from a cassette is reproduced through loudspeakers 13 at a volume which corresponds to the volume signal applied at output stage 12.

At the same time, a speed signal V, corresponding to the speed of the vehicle, is fed to automatic volume control device 20 via the first input 21.

If the user of motor vehicle radio 10 wishes to adjust the volume manually, two-position switch 16 is switched over to its manual position, in which movable contact 16'' lies against the first fixed contact 16', so that the volume signal supplied by manual volume-setting device 14 is fed to output stage 12.

In this setting, the automatic volume control device can be programmed or adjusted according to the requirements of the individual user.

For this purpose, at a particular speed of travel, the desired volume is set by means of manual volume-setting device 14. Then the user actuates momentary-contact switch 18, so that the volume signal supplied by manual volume-setting device 14 is applied, via conductor 17 and momentary-contact switch 18, to automatic volume control device 20. Now a digital speed signal as well as a digital volume signal are applied to a storage and control circuit 23. These two signals, applied at the same time and associated with each other, are now entered in an appropriate memory of storage and control circuit 23.

Thereafter, the same volume or a different volume can be set manually for another vehicle speed, and momentary-contact switch 18 is again actuated, so that this process repeats itself. When this is done, if a volume signal is already stored which is associated with the speed being traveled at that time, because of an earlier programming of storage and control circuit 23, this old value of the volume is simply overwritten.

After the individually set volumes or the associated digitalized volume signals, have been stored in the desired manner, the programming or the adjustment of storage and control circuit 23 is completed.

Now two-position switch 16 can be placed in its automatic position, in which movable contact 16'' lies against the second fixed contact 16''', so that the volume signal existing at the output of automatic volume control device 20 is fed to output stage 12 of radio component 11.

Now speed signal V, applied at the first input, and whose frequency preferably corresponds to the speed being traveled, is applied to storage and control circuit 23 by analog-to-digital converter 22, which converts the applied frequency signal to a corresponding analog volume signal. From the stored speed-volume signal pairs, this circuit 23 determines that the digitalized volume signal associated with the speed being traveled, and this volume signal is converted by digital-to-analog converter 26 to a corresponding analog volume signal and is fed to output stage 12, so that the reproduction is effected through loudspeakers 13 at the corresponding volume.

In this process, the volume of reproduction corresponding to the preset, stored volumes is reset as soon as the actual speed being traveled by the vehicle reaches a value for which an associated volume value is stored. This volume value is then used for producing a corresponding volume signal until the speed of the vehicle reaches the next speed for which an associated digital volume signal has been stored in the memory of storage and control circuit 23.

Thus, for example, if corresponding volume signals are digitally stored in the memory of storage and control circuit 23 for the speeds 30, 50, 75 and 100 km per hour, a corresponding volume signal will be emitted when the vehicle reaches an actual speed of 50 km per hour. This signal will continue to be applied as long as the vehicle travels at a speed which is greater than or equal to 50 km per hour but smaller than 75 km per hour. If the vehicle reaches a speed of 75 km per hour, the volume value corresponding to this speed is automatically used to generate a new volume signal. But if the vehicle is braked, and its speed falls below 50 km per hour, the volume value stored for the speed range from 30 to 50 km per hour is used to generate the volume signal. This volume value is stored in the storage and control circuit together with the lower speed limit of this speed range, namely together with the digitalized speed value for 30 km per hour.

The embodiments of the invention in which an exclusive property or privilege is claimed are defined as follows:

1. A motor vehicle radio with an automatic volume control device, to which is fed a speed signal detected by a speed sensor and which delivers a volume signal associated with the detected speed signal, and with a manual volume-setting device which generates a volume signal corresponding to the volume which has been set, characterized by the fact that a two-position switch (16) is provided for selectively transmitting the volume signal of the automatic volume control device (20) or of the manual volume-setting device (14) to an output stage (12) of the radio (10) which feeds loudspeakers (13); and a storage and control circuit (23) which includes a memory in which the volume signal corresponding to the adjusted volume can be stored when the manual volume-setting device (14) is switched on following a detection signal for a desired vehicle speed.

2. The motor vehicle radio in accordance with claim 1, characterized by the fact that the volume signal of the manual volume-setting device (14) can be applied to the automatic volume control device (20) by means of a momentary-contact switch (18).

3. The motor vehicle radio in accordance with claim 2, characterized by the fact that the volume signal of the manual volume-setting device (14) can be applied to the storage and control circuit (23) of the automatic volume control device (20) by means of an analog-to-digital converter (25).

4. The motor vehicle radio in accordance with claim 3, characterized by the fact that the volume signal applied to the storage and control circuit (23) serves as the detection signal.

5. The motor vehicle radio in accordance with claim 1 characterized by the fact that the volume signal supplied by the storage and control circuit (23) as a function of the speed signal (V) is applied to the two-position switch (16) as a voltage signal by means of a digital-to-analog converter (26).

6. The motor vehicle radio in accordance with claim 5 characterized by the fact that the memory of the storage and control circuit (23) is a write/read memory, the content of whose memory can be overwritten.

* * * * *